(12) United States Patent
Patterson

(10) Patent No.: US 8,377,749 B1
(45) Date of Patent: Feb. 19, 2013

(54) INTEGRATED CIRCUIT TRANSMISSION LINE

(75) Inventor: Joseph Martin Patterson, Carlsbad, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 783 days.

(21) Appl. No.: 12/560,187

(22) Filed: Sep. 15, 2009

(51) Int. Cl.
*H01L 21/44* (2006.01)

(52) U.S. Cl. .................. 438/123; 438/112; 438/124

(58) Field of Classification Search .................. 438/111, 438/112, 123, 124, 126, 127
See application file for complete search history.

(56) References Cited

U.S. PATENT DOCUMENTS

| | | | |
|---|---|---|---|
| 5,622,898 A * | 4/1997 | Zechman | 438/127 |
| 6,573,124 B1 * | 6/2003 | Chou et al. | 438/126 |
| 6,770,822 B2 * | 8/2004 | Pasternak et al. | 174/260 |
| 2009/0072370 A1 * | 3/2009 | Horiuchi et al. | 257/676 |

* cited by examiner

*Primary Examiner* — Kevin M Picardat

(57) ABSTRACT

A method is provided for fabricating a transmission line between electrical circuits. The method initially provides a first electrical circuit with a signal interface and a reference voltage interface, and a second electrical circuit with a signal interface and a reference voltage interface. The first circuit signal interface is connected to the second circuit signal interface with a metal wire. An insulator coating (e.g., poly-paraxylylene) is formed, encapsulating the wire. Then, an electrically conductive coating is formed, encapsulating the insulator coating. Typically, the conductive coating is connected to at least one of the first and second circuit reference voltage interfaces. In one aspect, the first circuit signal interface connection to the second circuit signal interface is a transmission line formed from the combination of the wire, insulator coating, and conductive coating. The transmission line has a frequency-dependent characteristic impedance responsive to the wire diameter, insulator thickness, and dielectric constant.

14 Claims, 4 Drawing Sheets

INTEGRATED CIRCUIT TRANSMISSION LINE

BACKGROUND OF THE INVENTION

1. Field of the Invention

This invention generally relates to integrated circuit UC) fabrication and, more particularly, to a method for the in-situ formation of transmission lines from conventional wire connections.

2. Description of the Related Art

IC signals, processor rates, and communication interface bandwidths all continue to increase in speed. High speed signals are best controlled when conducted through connectors having known transmission characteristics, into loads having matched impedances. It is well known to connect circuit interfaces with matching impedances using a coaxial type transmission line (coax). A coax is comprised of a center conductor with a known diameter, a surrounding insulator, with a known dielectric constant and outer diameter (thickness), and a shield. The signal is carried via the center conductor and the shield is connected to a reference voltage, such as ground.

It is also known to fabricate transmission lines internal to, or on top of circuit boards using microstrip, stripline, or waveguide techniques. Schematically, a transmission line, whatever the type, can be thought of as a series inductor and resistor, with a shunt capacitor.

IC devices are formed from a die of an active semiconductor device. The die can be mounted in a hybrid circuit, printed circuit board (PCB), or a package. For environmental protection, the die may be covered by a passivation layer. However, a package is more typically used since it also dissipates heat and provides a lead system for electrical connections. There are many different types of packages including through-hole, surface mount device (SMD) dual/quad, and SMD area array packages. While the package provides protection, it makes access to the die difficult.

FIGS. 1A and 1B are perspective views of a dual in-line package (DIP) and an IC die without a package, respectively (prior art). It is common for a package body or lead frame 100 to have a die attach area 102. The die 106 has electrical contact pads on its top surface. Inner leads 108 connect pads on the die top surface to outer leads or lead frames 110. Once the inner leads are bonded to the lead frames, the package is sealed with ceramic, in a metal can, or in a polyimide. Epoxy resins are also a common choice.

DIP packages are relatively easy to manufacture and easy to integrate into circuit boards. While transmission lines can be fabricated in the IC die, and in the circuit board to which the IC is eventually integrated, the wire bonds formed in the IC, from the die to the chip carrier lead frames are simple wires that do not have a controlled impedance, and which promote cross-talk. Thus, it is becoming increasing impractical to use DIP and other IC packages that rely upon wire bonding, to carry high-speed signals.

One solution to the problem is to minimize the influence of the chip carrier. The IC device shown in FIG. 1B surface mounts to a PCB socket. The input and output contacts of an IC chip are generally disposed in grid-like patterns that substantially cover a surface of the device or in elongated rows which may extend parallel to and adjacent each edge of the device's front surface, or in the center of the front surface.

For example, a surface mounted chip carrier has terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. These wires are much shorter than the wires bonds used in DIP packages. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

An IC that is designed to be surface mounted has pads, or flat conductive discs, on its packaging. Many packages include solder masses in the form of solder balls, typically about 1.0 mm and about 0.8 mm (40 mils and 30 mils) in pitch, and 0.4 to 0.5 mm in diameter, attached to the terminals of the package. A package having an array of solder balls projecting from its bottom surface is commonly referred to as a ball grid array or "BGA" package. For a BGA device there are solder bumps on the pads for connection with a BGA socket. The solder bumps typically fit into grips on a BGA socket for connection to a PCB. Other packages, referred to as land grid array or "LGA" packages are secured to the substrate by thin layers or lands (pads) formed from solder. The pads of an LGA require a socket containing springs or some other type of conductive trace to connect the device to the PCB.

One problem with BGA contacts is that the soldering operation is relatively complicated, requiring complicated board processing equipment. Generally, BGA contact ICs are cost effective for ICs having more than 100 pads. However, while wire bonding is more cost effective for smaller pin count packages, the relatively long lengths of the wire bonds are not shielded, and do not have a controlled impedance, which are required in many high frequency applications.

It would be advantageous if IC dies could be connected to chip carriers with transmission lines instead of wire bonds. It would be advantageous if the above-mentioned ICs could be initially fabricated with conventional wires bonds that can be converted in-situ to transmission lines.

SUMMARY OF THE INVENTION

A process is described herein that uniformly coats the wires, and anything else exposed, with a selected thickness of insulator that is suitable for use as the dielectric element in a coaxial cable configuration. The insulator is then blanket coated with a metallic later to complete the coaxial configuration. The wired bonded units are placed in a parylene coating system (vacuum chamber) and parylene is allowed to coat all exposed surfaces to a controlled thickness. The units are then removed from the chamber and coated with a metal layer common to ground. This metal layer may be a metal filled epoxy overmold.

Accordingly, a method is provided for fabricating a transmission line between electrical circuits. The method initially provides a first electrical circuit with a signal interface and a reference voltage interface, and a second electrical circuit with a signal interface and a reference voltage interface. The first circuit signal interface is connected to the second circuit signal interface with a metal wire. An insulator coating (e.g., poly-para-xylylene) is formed, encapsulating the wire. Then, an electrically conductive coating is formed, encapsulating the insulator coating. Typically, the conductive coating is connected to at least one of the first and second circuit reference voltage interfaces.

In one aspect, the first circuit signal interface connection to the second circuit signal interface is a transmission line formed from the combination of the wire, insulator coating, and conductive coating. The transmission line has a frequency-dependent characteristic impedance responsive to the wire diameter, insulator thickness, and dielectric constant.

Additional details of the above-described method, and an IC with transmission line wire bonds between a die and a chip carrier, are provided below.

DETAILED DESCRIPTION

Figure 1A:
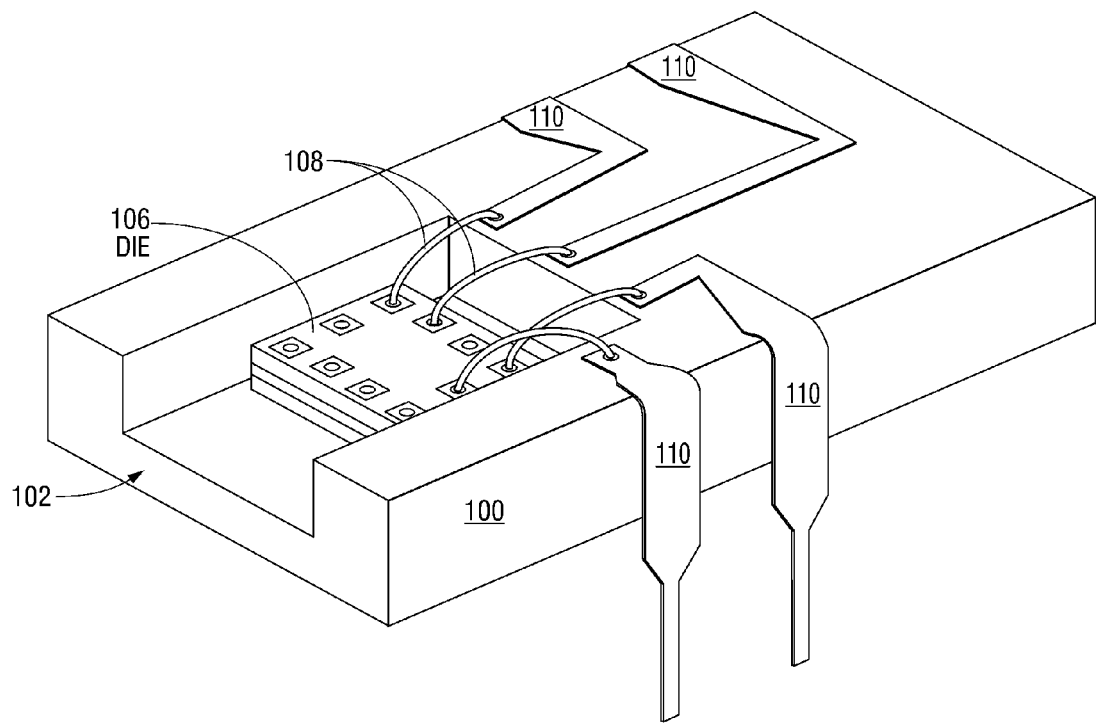
FIGS. 1A and 1B are perspective views of a dual in-line package (DIP) and an IC die without a package, respectively (prior art).
Figure 1B:
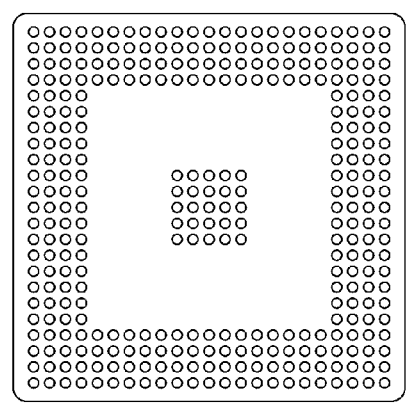
Figure 2A:
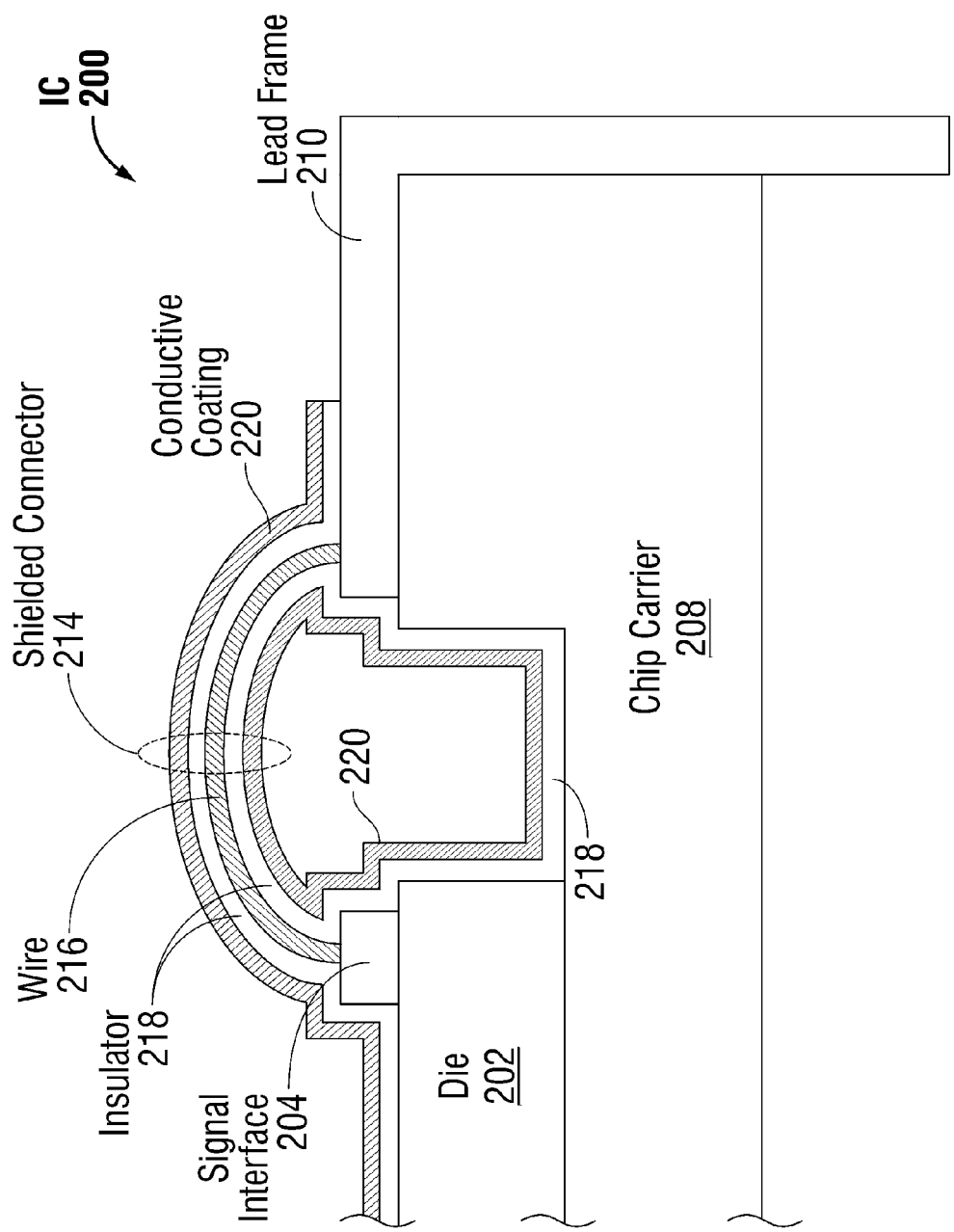
FIGS. 2A and 2B are partial cross-sectional and plan views, respectively, of an IC with transmission line wire bonds between a die and a chip carrier.
Figure 2B:
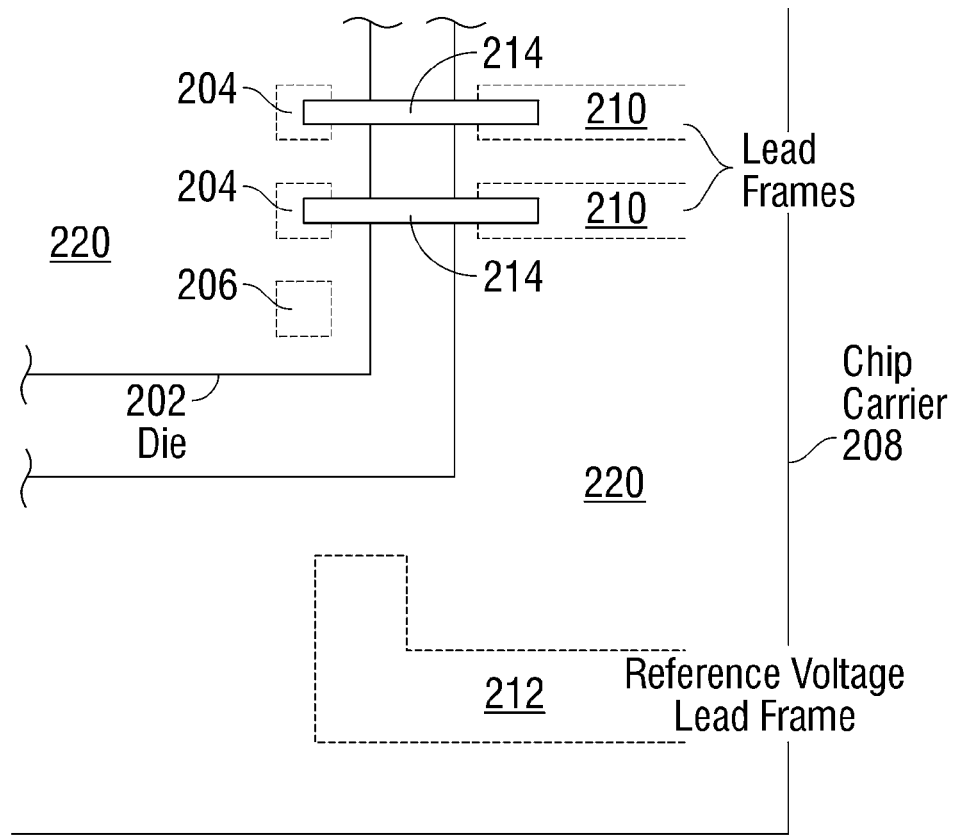

FIGS. 2A and 2B are partial cross-sectional and plan views, respectively, of an IC with transmission line wire bonds between a die and a chip carrier. The IC 200 comprises an electrical circuit die 202 with a plurality of signal interfaces 204 and at least one reference voltage interface 206. A chip carrier 208 is also shown with a plurality of signal lead frames 210. Typically, at least one lead frames is for reference voltage 212. Shielded connectors 214 are formed between the die signal interfaces 204 and the chip carrier signal lead frames 210.

Figure 3:
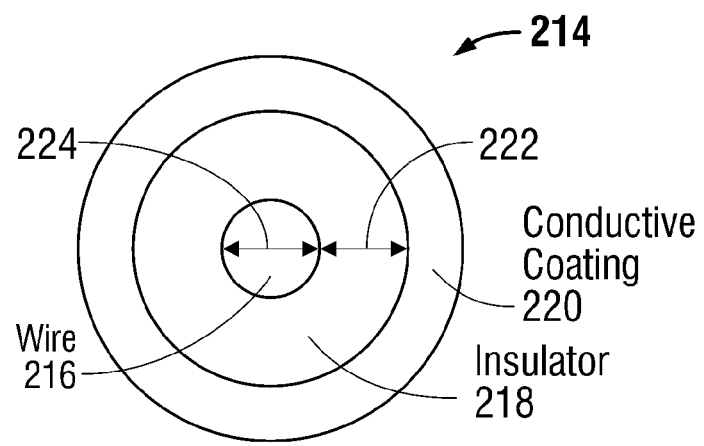
FIG. 3 is a partial cross-sectional view of the shielded connector of FIG. 2.

FIG. 3 is a partial cross-sectional view of the shielded connector of FIG. 2. Each shielded connector 214 includes a metal wire 216 with one end bonded to a die signal interface, and the other end bonded to a signal lead frame. An insulator coating 218 encapsulates the wire 216, and an electrically conductive coating 220 encapsulates the insulator coating 218.

In one aspect, the conductive coating 220 isotropically covers unmasked portions of the die 202 and chip carrier 208, see FIGS. 2A and 2B. Typically, the insulator coating 220 is poly-para-xylylene. As shown, the conductive coating 220 is connected to the die reference voltage interface 206. Alternately, the conductive coating may be connected to the lead frame reference voltage 212, or both reference voltage interfaces 212 and 206. As shown in FIG. 2B, the conductive coating 200 conformally coats the die and chip carrier. The conductive coating is connected to the reference voltage interfaces if these areas are masked during insulator deposition. Typically, a reference voltage is a ground or a dc power supply voltage. A variety of conventional IC processes are known that are capable of isotropically depositing conductive materials such as copper, silver, or gold. Further, a carbon or conductive epoxy paint may be used. In one aspect not shown, the conductive coating is overmolded bulk conductive epoxy.

The insulator coating 218 has a dielectric constant. Like the conductive coating 220, the insulator coating 218 may also isotropically covers unmasked portions of the die 202 and chip carrier 208, as well as the each wire 216.

Returning the FIG. 3, the insulator has a thickness or outer diameter 222. The combination of each wire bond 216, insulator coating 218, and conductive coating 220 forms a transmission line having a frequency-dependent characteristic impedance responsive to the wire diameter 224, insulator thickness 222, and dielectric constant.

Functional Description

Poly-para-xylylene is a well-known electronics industry conformal coating that is conventionally used to protect circuitry from ambient air, moisture, chemicals, or ultraviolet (UV) radiation. In application, wire bonded units are placed in a vacuum chamber. The surfaces not to be coated are covered with latex, or some other masking material. After the poly-para-xylylene coating is applied, the masking is removed and the units are taken from the chamber. Poly-para-xylylene has been mentioned as an easy to use material, common to many conventional IC fabrication processes. However, the transmission lines can be made with other insulator materials known in the art that can be isotropically deposited.

Next, a conductive coating is applied over the poly-para-xylylene. The conductive coating connects to the areas that were previously masked, which may be one of more reference voltage (ground) interfaces. After the transmission lines are formed, the units continue through the normal packing process steps.

It is well known to conformally coat IC surfaces with a metal using sputtering, chemical vapor deposition (CVD), low pressure CVD (LPCVD), evaporation, or dipping processes. As noted above, the transmission lines can be encapsulated with conductive epoxy, meaning all sides of the package are covered with epoxy. When overmolded, just the top side of the die and wire get covered, and not the bottom side of package. As differentiated from a thin film of epoxy, overmold is a bulk volume and not a thin layer. In one aspect, a thin layer of conductive material overlies the poly-para-xylylene, and is then covered with a non-conductive overmold. Alternately, the overmold is conductive and serves both purposes. Silver filled epoxy is an example of a conductive overmold.

Figure 4:
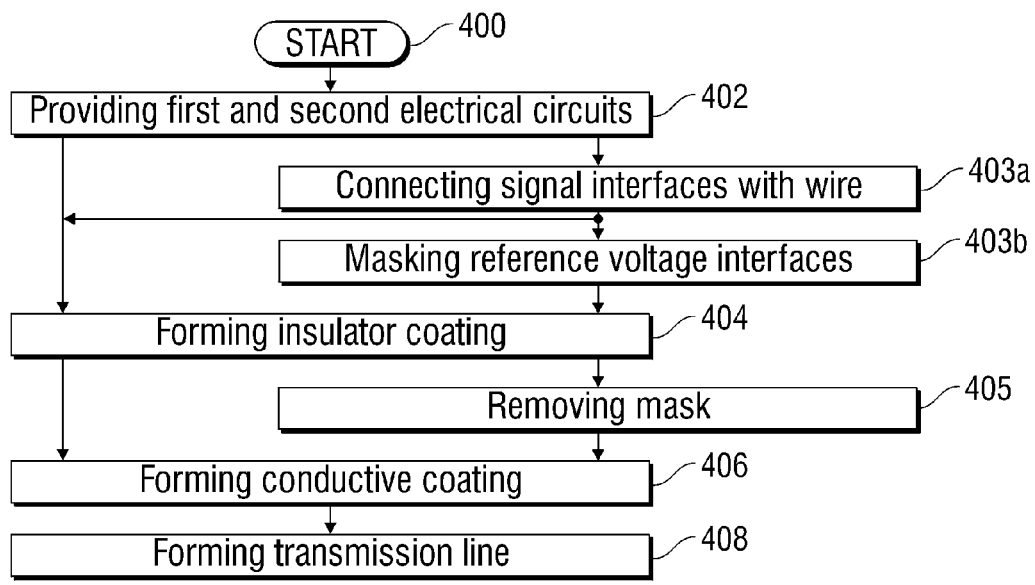
FIG. 4 is a flowchart illustrating a method for fabricating a transmission line between electrical circuits.

FIG. 4 is a flowchart illustrating a method for fabricating a transmission line between electrical circuits. Alternately, the method may be understood as the in-situ conversion of a wire connection, or wire bond, into a coax transmission line. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 400.

Step 402 provides a first electrical circuit with a signal interface, and a second electrical circuit with a signal interface. Step 403a connects the first circuit signal interface to the second circuit signal interface with a metal wire. Alternately, Step 402 provides a first electrical circuit with a signal interface connected with a wire to a second electrical circuit with a signal interface. Step 404 forms an insulator coating encapsulating the wire. In one aspect, the insulator is poly-para-xylylene. Step 406 forms an electrically conductive coating encapsulating the insulator coating. The conductive coating can be carbon paint, conductive epoxy paint, copper, silver, gold, or overmolded bulk conductive epoxy. The conductive coating may be formed using a process such as sputtering, CVD, evaporation, clipping, or electroplating a seed layer.

In one aspect, Step 402 provides first and second electrical circuits, each having at least one reference voltage interface, and Step 406 connects the conductive coating to at least one of the first and second circuit reference voltage interfaces. In a related aspect, prior to forming the insulator coating, Step 403*b* may mask the reference voltage interface(s), and subsequent to forming the insulator coating and prior to forming the conductive coating, Step 405 removes the reference voltage interface masks.

In another aspect, Step 402 provides a wire connection having a diameter, and Step 404 forms the insulator coating having a dielectric constant and a thickness. If Step 406 connects the conductive coating to at least one the reference voltage interfaces of the first and second circuits, then the method comprises a further step. Step 408 forms a transmission line from the combination of the wire, insulator coating, and conductive coating. The transmission line has a frequency-dependent characteristic impedance responsive to the wire diameter, insulator thickness, and dielectric constant.

Figure 5:
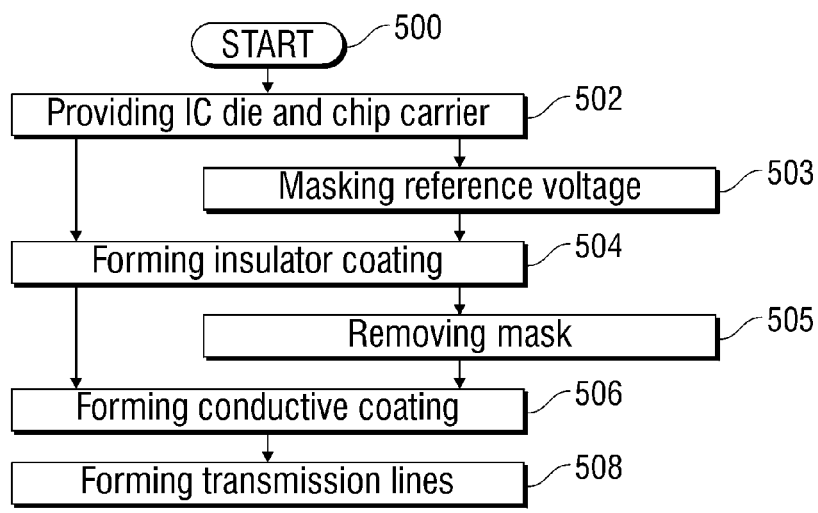
FIG. 5 is a flowchart illustrating a method for fabricating transmission line wire bonds between an IC die and a chip carrier.

FIG. 5 is a flowchart illustrating a method for fabricating transmission line wire bonds between an IC die and a chip carrier. The method begins at Step 500. Step 502 provides an IC die with a plurality of signal interfaces wire bonded to a plurality of chip carrier signal lead frames. Alternately, the method includes an additional step for forming the wire bonds. Step 504 forms an insulator coating (e.g., poly-para-xylylene) encapsulating each wire bond. Step 506 forms an electrically conductive coating encapsulating each insulator coating. The conductive coating can be carbon paint, conductive epoxy paint, copper, silver, gold, or overmolded bulk conductive epoxy. The conductive coating may be formed using a process such as sputtering, CVD, evaporation, dipping, or electroplating a seed layer.

In one aspect, Step 502 provides an IC die with a reference voltage interface and a chip carrier with a reference voltage lead frame interface, and Step 506 connects the conductive coating to at least one of the die or lead frame reference voltage interfaces. In a related aspect, prior to forming the insulator coating, Step 503 masks the die reference voltage interface and a reference voltage lead frame contact point. Subsequent to forming the insulator coating and prior to forming the conductive coating, Step 505 removes the reference voltage interface masks.

In another aspect, Step 502 provides wire bonds having a diameter, and Step 504 forms insulators having a thickness (outer diameter) and a dielectric constant. If Step 506 connects the conductive coating to at least one of the die reference voltage interface or the reference voltage lead frame, the method comprises a further step. Step 508 forms a transmission line from the combination of each wire bond, insulator coating, and conductive coating. Each transmission line has a frequency-dependent characteristic impedance responsive to the wire diameter, insulator thickness, and dielectric constant.

A method for the in-situ conversion of a wire connection, to a transmission line, has been provided, along with an IC die with transmission line connections to a chip carrier. Examples of materials and specific fabrication processes have been given to illustrate the invention. However, the invention is not limited to merely these examples. Other variations and embodiments of the invention will occur to those skilled in the art.

I claim:

1. A method for fabricating a transmission line between electrical circuits, the method comprising:
   providing a wire coupling a first electrical circuit with a signal interface to a second electrical circuit with a signal interface, the wire comprising a predetermined diameter;
   forming an insulator coating encapsulating the wire, wherein the insulator coating comprising a predetermined thickness and a predetermined dielectric constant;
   forming an electrically conductive coating encapsulating the insulator coating; and
   forming a transmission line from the combination of the wire, the insulator coating and the electrically conductive coating, the transmission line comprising a controlled frequency-dependent characteristic impedance responsive to the predetermined diameter of the wire, the predetermined thickness of the insulating coating and the predetermined dielectric constant of the insulator coating.

2. The method of claim 1 wherein each of the first and second electrical circuits comprises at least one reference voltage interface; and,
   wherein further forming the conductive coating includes connecting the conductive coating to the at least one of the first and second circuit reference voltage interfaces.

3. The method of claim 1 wherein forming the insulator coating includes forming a poly-para-xylylene coating.

4. The method of claim 1 wherein forming the electrically conductive coating includes forming an electrically conductive coating from a material selected from a group consisting of carbon paint, conductive epoxy paint, copper, silver, gold, and overmolded bulk conductive epoxy.

5. The method of claim 4 wherein forming the electrically conductive coating includes using a process selected from a group consisting of sputtering, chemical vapor deposition (CVD), evaporation, dipping, and electroplating.

6. The method of claim 1 further comprising:
   prior to forming the insulator coating, masking the reference voltage interfaces; and,
      subsequent to forming the insulator coating and prior to forming the electrically conductive coating, removing the reference voltage interface masks.

7. A method for fabricating transmission line wire bonds between an integrated circuit (IC) die and a chip carrier, the method comprising:
   providing a plurality of wire bonds between an IC die with a plurality of signal interfaces and a plurality of chip carrier signal lead frames, the plurality of wire bonds comprising a predetermined diameter;
   forming an insulator coating encapsulating each of the plurality of wire bonds, the insulator coating comprising a predetermined thickness and a predetermined dielectric constant; and,
   forming an electrically conductive coating encapsulating each insulator coating;
   forming a transmission lines from the combination of each of the plurality of wire bonds, the insulator coating and the electrically conductive coating that encapsulate each of the plurality of wire bonds, each transmission line comprising a controlled frequency-dependent characteristic impedance responsive to the predetermined diameter of the plurality of wire bonds, the predetermined thickness of the insulator coating, and the predetermined dielectric constant of the insulator coating.

8. The method of claim 7 wherein the IC die comprises a reference voltage interface, and wherein the chip carrier comprises a reference voltage lead frame interface; and,
   wherein forming the electrically conductive coating includes connecting the electrically conductive coating to at least one of the IC die and chip carrier signal lead frame reference voltage interfaces.

9. The method of claim 7 wherein forming the insulator coating includes forming a poly-para-xylylene coating.

10. The method of claim 7 wherein forming the electrically conductive coating includes forming a conductive coating from a material selected from a group consisting of carbon paint, conductive epoxy paint, copper, silver, gold, and overmolded bulk conductive epoxy.

11. The method of claim 7 further comprising:
prior to forming the insulator coating, masking the die reference voltage interface and a reference voltage lead frame contact point; and,
subsequent to forming the insulator coating and prior to forming the electrically conductive coating, removing the reference voltage interface masks.

12. An integrated circuit (IC) with transmission line wire bonds between a die and a chip carrier, the IC comprising:
an electrical circuit die with a plurality of signal interfaces and at least one reference voltage interface;
a chip carrier with a plurality of signal lead frames and at least one reference voltage lead frame;
shielded connectors between the die signal interfaces and the chip carrier signal lead frames, each shielded connector including:
a wire bonded to a die signal interface and a signal lead frame, the wire comprising a predetermined diameter;
an insulator coating encapsulating the wire; and,
an electrically conductive coating encapsulating the insulator coating;
wherein the insulator coating comprises a predetermined thickness and dielectric constant;
wherein the insulator coating isotropically covers unmasked portions of the die and chip carrier, including the wire;
wherein the conductive coating isotropically covers unmasked portions of the die and chip carrier and is connected to the die reference voltage interface and the reference voltage lead frame; and,
wherein the combination of each wire bond, insulator coating, and conductive coating forms a transmission line comprise a controlled frequency-dependent characteristic impedance responsive to the wire diameter, insulator thickness, and dielectric constant.

13. The IC of claim 12 wherein the insulator coating is poly-para-xylylene.

14. The IC of claim 12 wherein the conductive coating is a material selected from a group consisting of carbon paint, conductive epoxy paint, copper, silver, gold, and overmolded bulk conductive epoxy.

* * * * *